United States Patent
Hsieh et al.

(10) Patent No.: US 9,382,113 B2
(45) Date of Patent: Jul. 5, 2016

(54) METHOD FOR FABRICATING A SELF-ALIGNED VERTICAL COMB DRIVE STRUCTURE

(71) Applicant: Asia Pacific Microsystems, Inc., Hsinchu City (TW)

(72) Inventors: Jer-Wei Hsieh, Hsinchu (TW); Han-Tang Su, Hsinchu (TW)

(73) Assignee: ASIA PACIFIC MICROSYSTEMS, INC., Hsinchu (TW)

( * ) Notice: Subject to any disclaimer, the term of this patent is extended or adjusted under 35 U.S.C. 154(b) by 252 days.

(21) Appl. No.: 14/070,732

(22) Filed: Nov. 4, 2013

(65) Prior Publication Data

US 2014/0126031 A1 May 8, 2014

(30) Foreign Application Priority Data

Nov. 6, 2012 (TW) .............................. 101141129 A (51) Int. Cl.
*G02B 26/08* (2006.01)
*B81C 1/00* (2006.01)

(52) U.S. Cl.
CPC ........... *B81C 1/00603* (2013.01); *B81C 1/0015* (2013.01); *G02B 26/0833* (2013.01); *B81B 2201/042* (2013.01); *B81B 2203/0136* (2013.01)

(58) Field of Classification Search
CPC .. G02B 26/08; G02B 26/0841; G02B 26/105; G02B 26/085; G02B 26/0858; G02B 26/0833; G02B 26/101; Y10T 29/49124; B81B 3/0083; B81B 3/0086
See application file for complete search history.

(56) References Cited

U.S. PATENT DOCUMENTS

2012/0099176 A1* 4/2012 Zhou .................... G02B 26/101
359/291

* cited by examiner

*Primary Examiner* — Jennifer L. Doak
(74) *Attorney, Agent, or Firm* — Chen-Chi Lin (57) ABSTRACT

In a method for fabricating a self-aligned vertical comb drive structure, a multi-layer structure is first formed. The multi-layer structure includes inter-digitated first and second comb structures formed via etching using a first mask layer as a mask. The first comb structure includes a plurality of first comb fingers, each having a first finger portion formed in a first device layer and a second finger portion formed in a second device layer and separated from the first finger portion by a self-aligned pattern on a stop layer. The second comb structure includes a plurality of second comb fingers formed solely in the second device layer. The second finger portions of the first comb fingers are subsequently removed.

15 Claims, 10 Drawing Sheets

METHOD FOR FABRICATING A SELF-ALIGNED VERTICAL COMB DRIVE STRUCTURE

CROSS-REFERENCE TO RELATED APPLICATION

This application claims priority of Taiwanese Application No. 101141129, filed on Nov. 6, 2012.

BACKGROUND OF THE INVENTION

1. Field of the Invention

The invention relates to a method for fabricating a vertical comb drive structure, more particularly to a method for fabricating a self-aligned vertical comb drive structure and the self-aligned vertical comb drive structure that is fabricated using the method.

2. Description of the Related Art

A micro scanning mirror is currently one of the most widely utilized devices in a micro-opto-electromechnical system (MOEMS). Typically, the micro scanning mirror is actuated by a vertical comb drive actuator. The vertical comb drive actuator includes two comb structures that are disposed respectively on different device layers. The comb structures include a plurality of comb finger portions that are inter-digitated. In operation, when a potential difference is applied to the comb structures, one of the comb finger portions (e.g., a movable comb finger portion) moves with respect to the other one of the comb finger portions (e.g., a fixed comb finger portion).

It is essential in the fabrication process that the two comb structures be accurately positioned to ensure a distance therebetween is sufficient for movement during operation. This is essential since, when a higher potential difference is employed, the movement of the movable comb finger portion may become unstable (e.g., sideways movement may occur). Additionally, the vertical comb drive actuator is typically scaled down to an extent where a distance between the movable comb finger portion and the fixed comb finger portion may be as small as a few micrometers. In such cases, misalignment of the comb structures may result in greatly reduced performance of the vertical comb drive actuator.

Conventionally, a vertical comb drive actuator is fabricated first using a photolithography process to define respectively patterns of the two comb structures on two opposite sides of a wafer. The two comb structures are then formed via etching the two opposite sides of the wafer. In this way, it may be difficult to accurately form the patterns on the two opposite sides of the wafer to accurately correspond to each other, and in turn the comb structures thus formed may be somewhat misaligned.

In order to address the aforementioned alignment issue, methods for fabricating a self-aligned vertical comb drive actuator have been proposed. For example, U.S. Pat. No. 6,612,029 and US Patent Application Publication No. 2007/0241076 disclose such a method. Conventionally, in such a method, the photolithography process is utilized to form two etch stop layers on one side of the wafer, each of the etch stop layers having a distinct etch selectivity. Afterward, the one side is etched to form two comb structures using the two etch stop layers, respectively.

However, the methods employed in those prior art references have a number of drawbacks. For example, with an increased demand for performance of the vertical comb drive actuator, an aspect ratio (the ratio of a depth to a width of the formed trench between adjacent fingers) is typically increased as well. Furthermore, since two comb structures are formed from one side of the wafer, an etch depth may be too deep such that lateral etching may occur, resulting in shapes of an inner comb structure being different from the expected shapes.

It is also noted that, in the second embodiment of US Patent Application Publication No. 2007/0241076, an etch stop layer is disposed between two device layers. Removing the etch stop layer may prove difficult due to the increased aspect ratio that may prevent the etching agent from reaching the etch stop layer. While isotropic etching may be used to address this issue, occurrence of lateral etching still results in shapes of the inner comb structure being different from the expected shapes.

SUMMARY OF THE INVENTION

Therefore, the object of the present invention is to provide a method that is able to alleviate at least one of the drawbacks of the prior art listed above.

Accordingly, a method of the present invention is for fabricating a self-aligned vertical comb drive structure. The method comprises the following steps of:

a) forming a multi-layer structure that includes a first mask layer, a first device layer, a stop layer, a second device layer and a second mask layer arranged in the given order in a vertical direction, the stop layer being formed with a self-aligned pattern, the multi-layer structure further including a first comb structure and a second comb structure that are inter-digitated and that are formed via etching using the self-aligned pattern as a mask, the first comb structure including a plurality of first comb fingers, each having a first finger portion formed in the first device layer and a second finger portion formed in the second device layer and separated from the first finger portion by the self-aligned pattern, the second comb structure including a plurality of second comb fingers and being formed solely in the second device layer; and b) removing the second finger portions of the first comb fingers via etching using the second mask layer as a mask.

Another object of the present invention is to provide a self-aligned vertical comb drive structure that can be fabricated using the method.

Accordingly, a self-aligned vertical comb drive structure of the present invention comprises a first device layer, a second device layer separated from the first device layer by a gap, a first comb structure, and a second comb structure.

The first comb structure includes a plurality of first comb fingers formed solely in the first device layer. The second comb structure includes a plurality of second comb fingers formed solely in the second device layer.

The first comb fingers and the second comb fingers are inter-digitated. Furthermore, the first comb fingers and/or the second comb fingers tapers toward the gap.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Before the present invention is described in greater detail, it should be noted that like elements are denoted by the same reference numerals throughout the disclosure.

With reference to FIGS. 1 to 11, a first preferred embodiment of a method according to the present invention will now be described. The method is for fabricating a self-aligned vertical comb drive structure 100.

Figure 1:
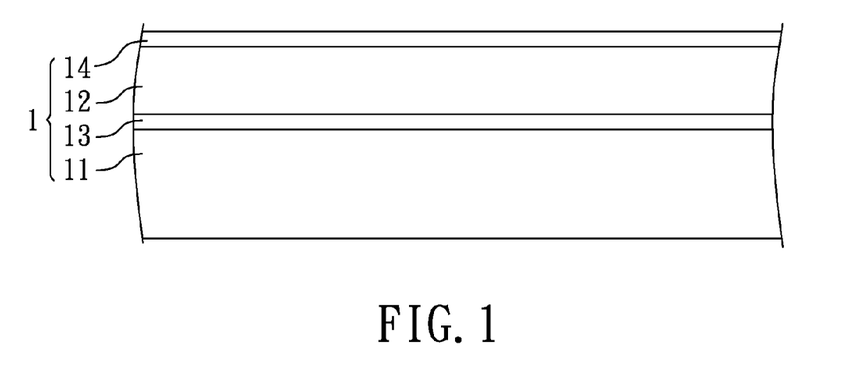
FIGS. 1 to 11 illustrate consecutive steps of a method for fabricating a self-aligned vertical comb drive structure, according to a first preferred embodiment of the invention.

In FIG. 1, a first wafer 1 is provided. The first wafer 1 includes a first base layer 11, a first mask layer 13, a first device layer 12 and a stop layer 14, arranged in the given order in a bottom-to-top direction.

Figure 2:
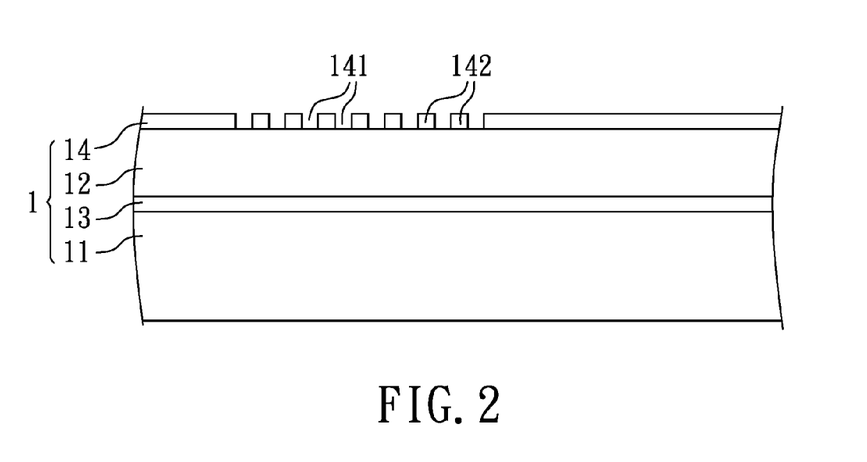

In FIG. 2, a self-aligned pattern is formed on the stop layer 14. In particular, the self-aligned pattern includes a plurality of spaced-apart grooves 141 and a plurality of stop parts 142, each being defined by two of the adjacent grooves 141. In this embodiment, the self-aligned pattern further includes at least one alignment mark (not shown in the drawings) in order to provide a reference for the subsequent steps.

Figure 3:
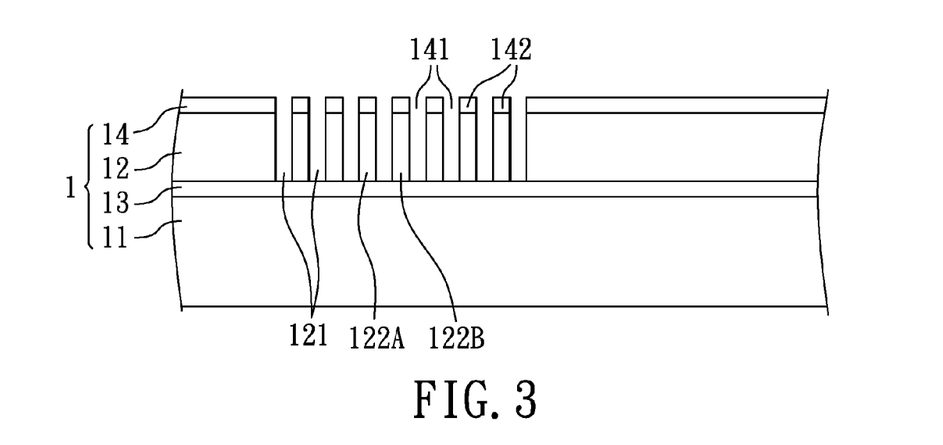

In FIG. 3, the first device layer 12 is etched using the self-aligned pattern on stop layer 14 as a mask and using the first mask layer 13 as an etch stop layer. As a result, a plurality of first etched trenches 121 are formed by the etching process, thereby forming a plurality of first finger portions 122A of a plurality of first comb fingers on the first device layer 12, as well as a plurality of redundant finger portions 122B that are inter-digitated with the first finger portions 122A of the first comb fingers on the first device layer 12.

Figure 4:
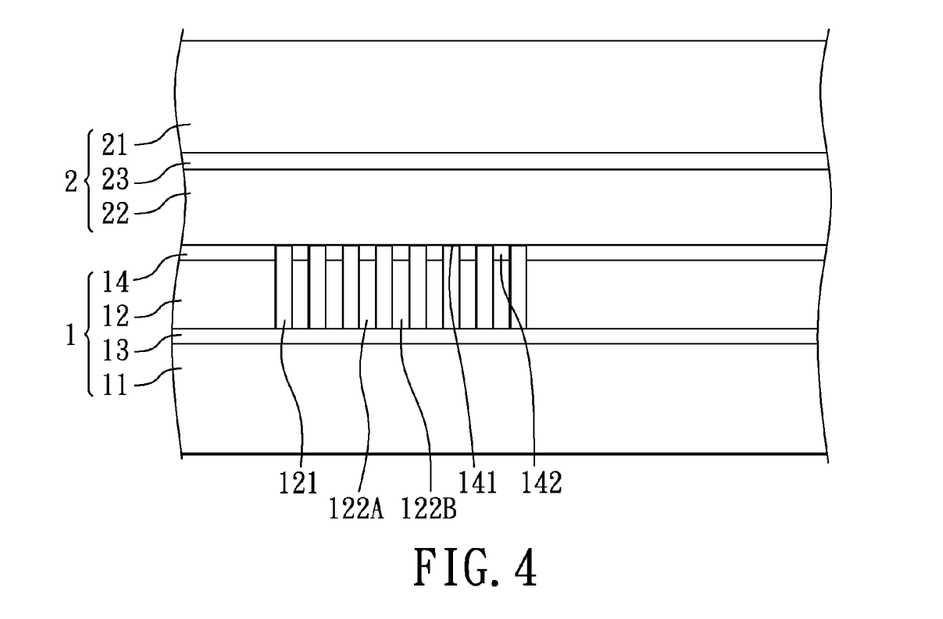

In FIG. 4, a second wafer 2 is bonded to the stop layer 14. The second wafer 2 includes a second base layer 21, a second device layer 22 and a second mask layer 23 disposed between the second device layer 22 and the second base layer 21.

Figure 5:
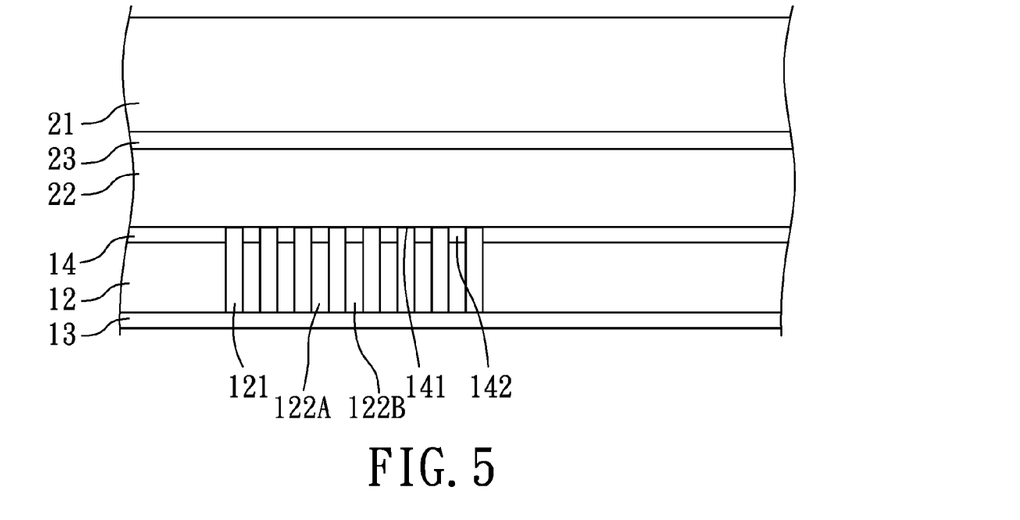

In FIG. 5, the first base layer 11 is removed to expose the first mask layer 13.

Figure 6:
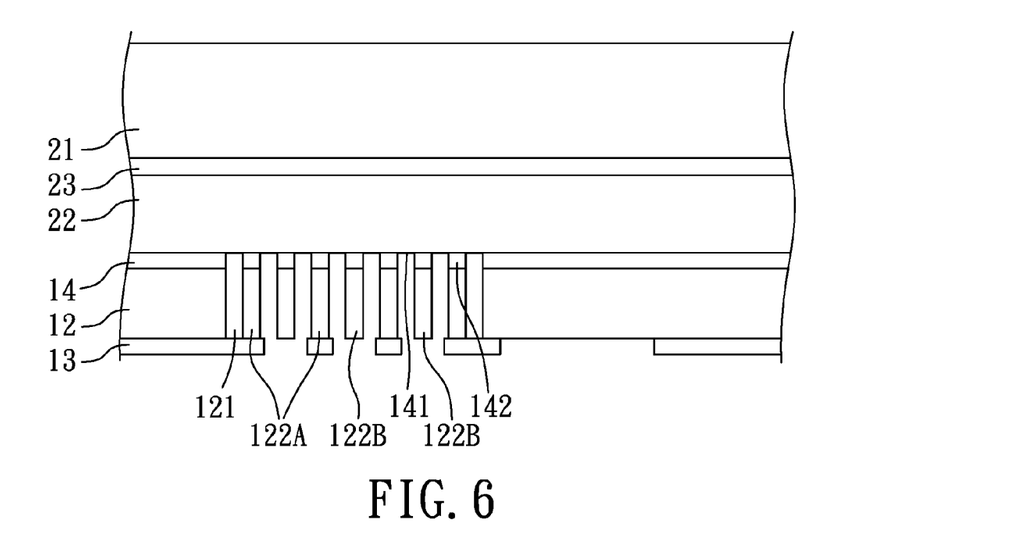

In FIG. 6, a pattern is formed on the first mask layer 13. Specifically, the redundant finger portions 122B are exposed, while the first finger portions 122A of the first comb fingers remain covered by the first mask layer 13. It is noted that, due to the previously-formed self-aligned pattern, the most critical alignment has been completed in this particular step. Therefore, any later processes maybe carried out using less stringent pattern forming (e.g., a width of the pattern for covering the first finger portions 122A may be not exactly identical to a width of the first finger portions 122A, and/or alignment between the pattern and the first finger portions 122A may be less accurate).

Figure 7:
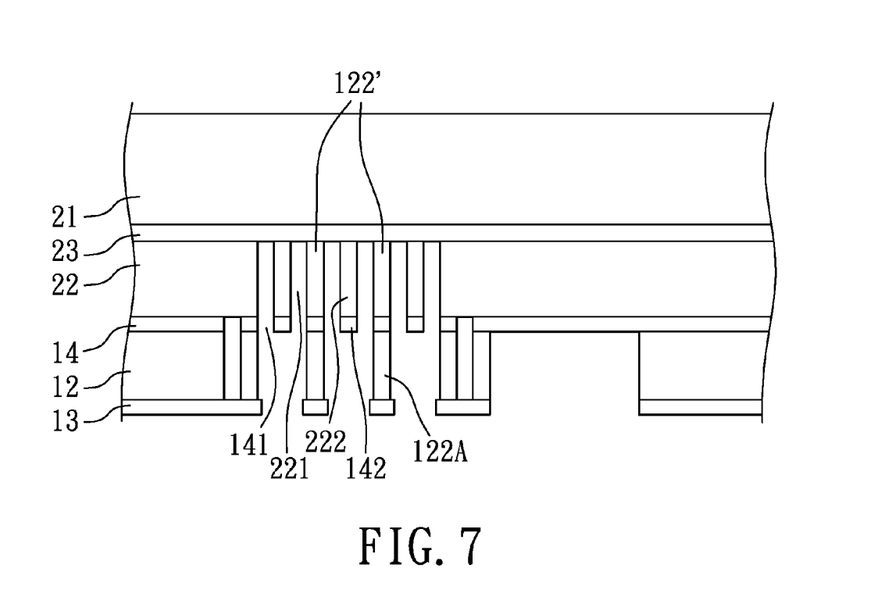

In FIG. 7, another etching operation is performed. Specifically, the first device layer 12 is etched using the first mask layer 13 as a mask and using the stop layer 14 as an etch stop layer. Therefore, the redundant finger portions 122B are removed. Additionally, the second device layer 22 is etched, using the self aligned pattern on stop layer 14 as a mask and using the second mask layer 23 as an etch stop layer. Therefore, a plurality of second etched trenches 221 are formed, and a plurality of second finger portions 122' of the first comb fingers and a plurality of second comb fingers 222 are defined on the second device layer 22.

The result of the operations shown in FIGS. 1 to 7 is the formation of a multi-layer structure having first and second comb structures. The first comb structure includes a plurality of first comb fingers, each having a first finger portion 122A and a second finger portion 122'. The second finger portion 122' formed in the second device layer 22 are separated from the first finger portions 122A by the self-aligned pattern. The second comb structure includes a plurality of second comb fingers 222 inter-digitated with the first comb fingers.

Figure 8:
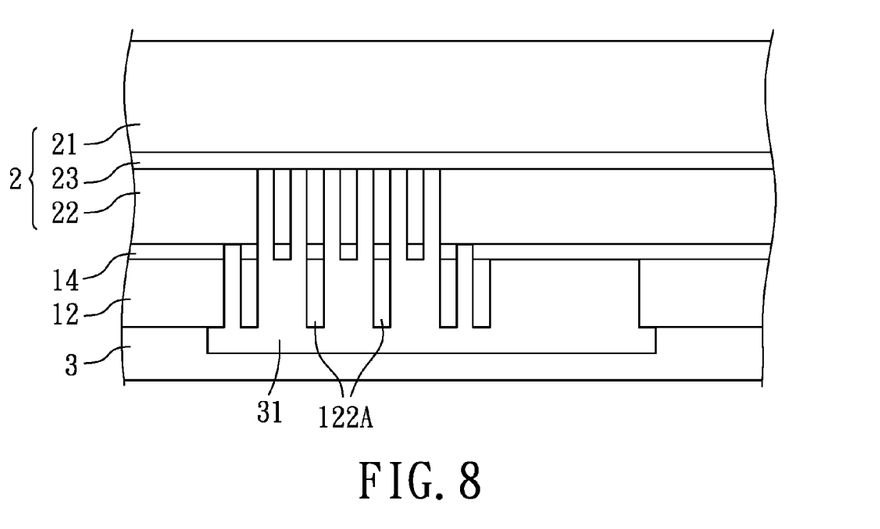

In FIG. 8, the first mask layer 13 is removed to expose the first device layer 12 and the first finger portions 122A of the first comb structure. Furthermore, a third wafer 3 is bonded to one side of the first device layer 12 opposite to the second device layer 22. Preferably, the third wafer 3 is formed with a recessed surface 31 that confronts the first comb structure.

In this particular step, the third wafer 3 may be bonded to the first device layer 12 using a bonding technique selected from wafer anodic bonding, wafer fusion bonding and wafer eutectic bonding.

Figure 9:
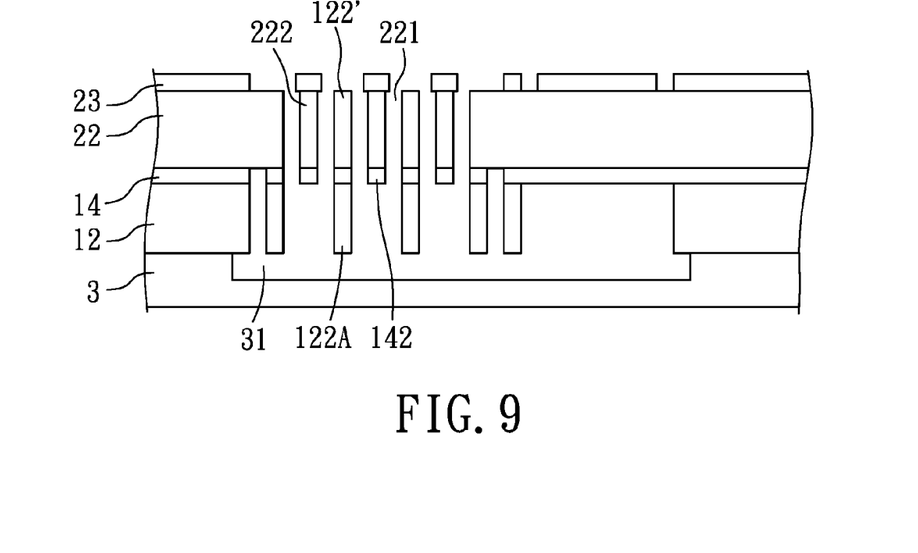

In FIG. 9, the second base layer 21 is removed, followed by forming a pattern on the second mask layer 23. Specifically, the second finger portions 122' are exposed as a result, and the second comb fingers 222 remain covered by the second mask layer 23. It is noted that in this particular step, a less stringent pattern forming may be employed as well.

Figure 10:
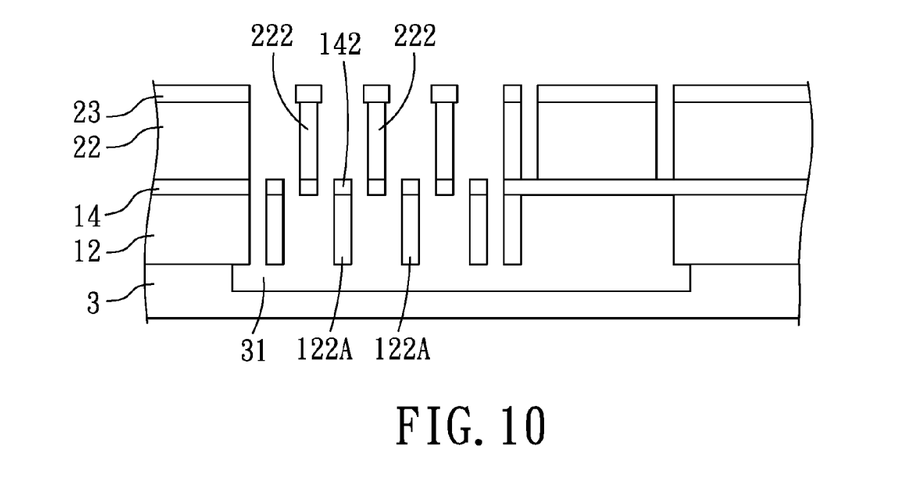

In FIG. 10, the second finger portions 122' of the first comb fingers are removed via etching using the second mask layer 23 as a mask.

Figure 11:
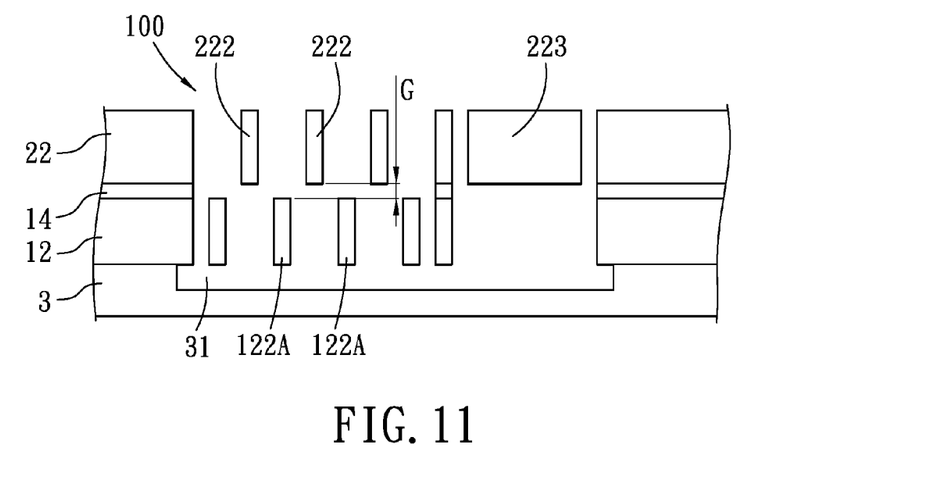

In FIG. 11, the second mask layer 23 and the self-aligned pattern of the stop layer 14 are removed, thus completing the fabrication of the self-aligned vertical comb drive structure 100. The removal of the stop layer 14 defines a gap (G) between the first finger portions 122A and the second comb fingers 222. Some portions of the stop layer 14 may be kept for the purpose of insulation.

In this embodiment, the first wafer 1 may be a silicon-on-insulator (SOI) wafer deposited with the stop layer 14. The second wafer 2 may be a SOI wafer as well. Preferably, the first mask layer 13, the stop layer 14 and the second mask layer 23 are made of silicon dioxide ($SiO_2$), and each of the layers 13, 14 and 23 has a thickness ranging from 1 to 2 micrometers. Each of the first device layer 12, and the second device layer 22 has a thickness of approximately 100 micrometers. Each of the first base layer 11, the second base layer 21, and the third wafer 3 has a thickness of approximately 400 micrometers. However, the dimensions of the layers and the materials used for forming the same are not limited to those used in this particular embodiment.

In this embodiment, the etching process may be carried out using inductively coupled plasma (ICP) etching process or deep reactive-ion etching (DRIE) process. These processes may enable formation of a comb structure with a higher aspect ratio.

By forming the self-aligned pattern (which defines the pattern to be employed in forming both the first comb fingers and the second comb fingers 222) on the stop layer 14 before bonding the first and second wafers 1 and 2, and subsequently using the stop layer 14 as a mask to etch the second device layer 22, the method of the first preferred embodiment may ensure that etch depths (i.e., a maximum distance between the etched part of the device layers and the mask) is limited to the thickness of the device layers, thereby ensuring that the first comb fingers and the second comb fingers 222 can be formed with the expected shapes.

It is also appreciated that, with a single etching operation (as shown in FIG. 7) and a common mask (i.e., the self-aligned pattern on the stop layer 14) to form both the first and second comb structures, a self-aligning effect can be achieved. In other words, since that the first finger portions 122A and the second comb fingers 222 are both formed using the self-aligned pattern through the same etching operation, misalignment due to using separate masks to form the first and second comb structures may be prevented, and the resulting first finger portions 122A and the second comb fingers 222 may be accurately and automatically aligned during fabrication.

Moreover, when employing the method according to this embodiment, the self-aligned pattern between the first and second comb structures may be removed with relative ease, overcoming the limitation on the conventional fabricating process that an insulating layer disposed between the comb structures may become difficult to remove when a high aspect ratio is involved in etching the comb drive structures.

Furthermore, since the precise scales of the first finger portions 122A and the second comb fingers 222 are defined using the stop layer 14, removal of the second finger portions 122' and the redundant finger portions 122B may be carried out with a less stringent pattern forming, thereby reducing the difficulty of fabrication.

Referring to FIGS. 6 to 11, in this embodiment, devices of a micro scanning mirror 223 (a movable structure) may be simultaneously formed during fabrication.

In this embodiment, the first base layer 11, the second base layer 21 and the third wafer 3 are disposed to serve as supporting structures.

As shown in FIGS. 12 to 15, the second preferred embodiment of the method for fabricating the self-aligned vertical comb drive structure 100 according to the present invention differs from the previous embodiment in terms of the following.

Figure 12:
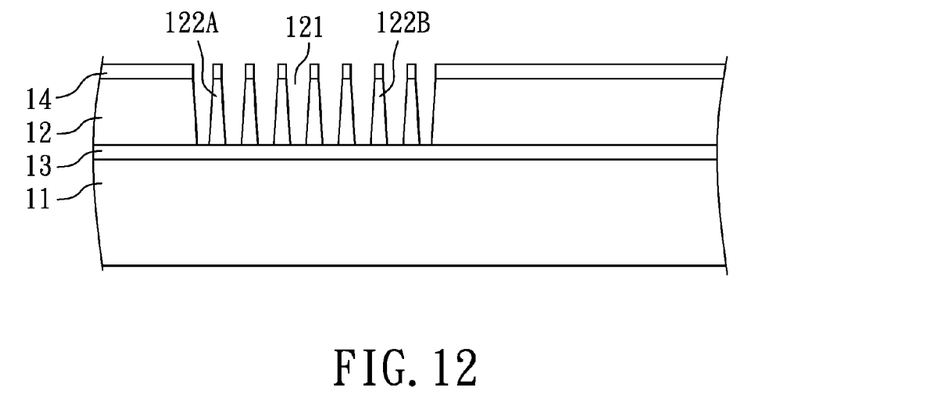
FIGS. 12 to 14 illustrate steps of a method that differ from those of the first preferred embodiment, according to a second preferred embodiment of the invention.

The operation shown in FIG. 12 corresponds to the operation of FIG. 3 in the previous embodiment. However, the etching of the first device layer 12 is configured (for example, by adjusting the etching parameters) such that the first etched trenches 121 taper in a direction from the stop layer 14 to the first mask layer 13 (that is, a thickness direction of the wafer 1 or the wafer 2 of FIG. 4). In other words, the first finger portions 122A and the redundant finger portions 122B are configured to taper in a direction toward the stop layer 14.

Figure 13:
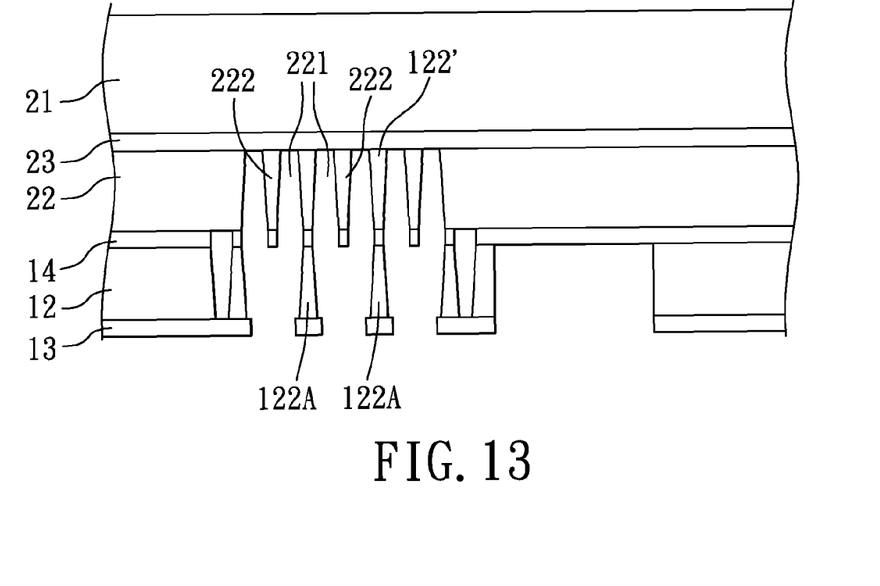

Similarly, the operation shown in FIG. 13 corresponds to the operation of FIG. 7 in the previous embodiment. The etching of the second device layer 22 is also configured such that the second etched trenches 221 taper in a direction from the stop layer 14 to the second mask layer 23. In other words, the second finger portions 122' and the second comb fingers 222 taper in a direction toward the stop layer 14.

Figure 14:
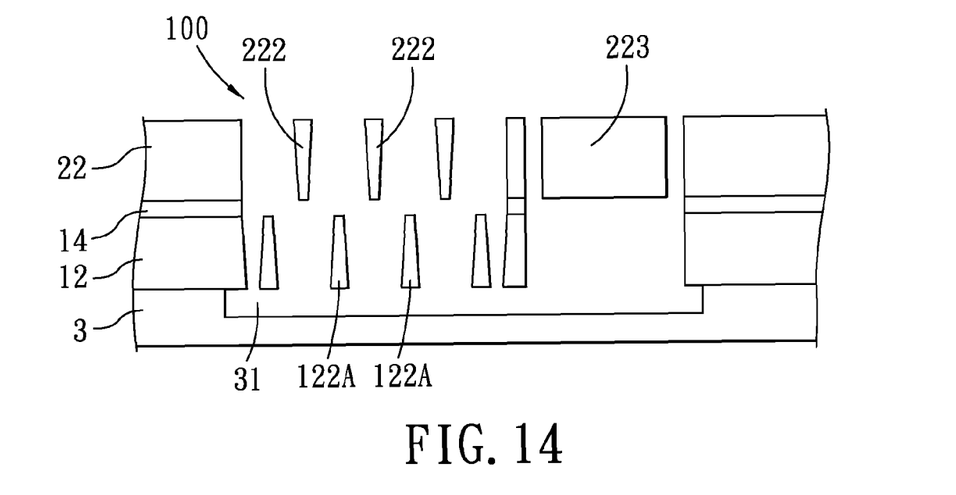

FIG. 14 illustrates the resulting self-aligned vertical comb drive structure 100, with a plurality of spaced-apart first finger portions 122A, and a plurality of second comb fingers 222 that are inter-digitated with the first finger portions 122A.

Figure 15:
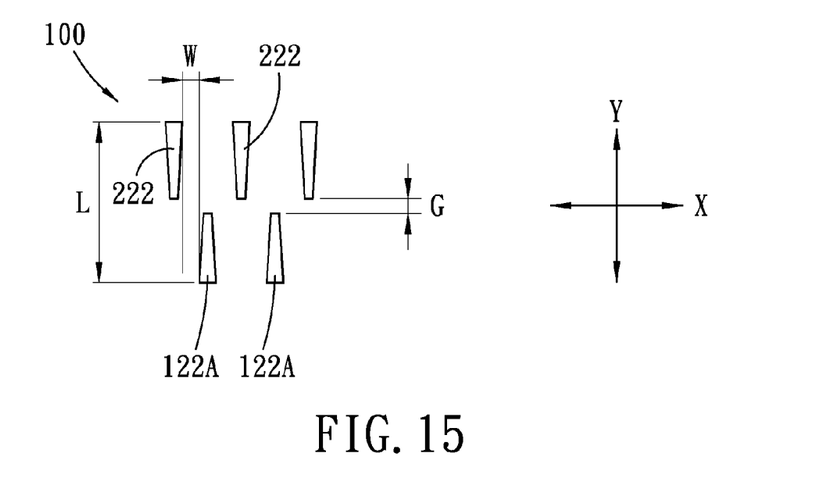
FIG. 15 is a fragmentary view of FIG. 14, showing a preferred dimensional specification according to the second preferred embodiment.

Specifically, as shown in FIG. 15, each of the first finger portions 122A does not overlap with the second comb fingers 222 with respect to either a vertical direction (Y) or a horizontal direction (X), and the second comb fingers 222 are separated from the first finger portions 122A by a gap (G). It can be seen that, the second finger portions 122' and the second comb fingers 222 taper in a direction toward the gap (G) (that is, a thickness direction of the wafer 1 or the wafer 2 of FIG. 4).

Furthermore, distances (W) between each of the first comb finger portions 122A and adjacent ones of the second comb fingers 222 along the horizontal direction (X) are equal.

By employing such a configuration wherein the first finger portions 122A and the second comb fingers 222 taper toward the gap (G), a number of advantages may be attained. For example, when the self-aligned vertical comb drive structure 100 is to serve as an actuator, a potential difference required to function properly may be reduced. Moreover, when the self-aligned vertical comb drive structure 100 is to serve as a sensor, sensitivity thereof may be increased.

In this embodiment, the first finger portions 122A have distal ends distal from the second comb fingers 222, and the second comb fingers 222 have distal ends distal from the first finger portions 122A. A distance between the distal ends of the first finger portions 122A and the distal ends of the second comb fingers 222 along the vertical direction (Y) is defined as (L). In other words, (L) may be expressed as a summation of a height of the first finger portions 122A, the second comb fingers 222 and the gap (G).

A minimum distance between the distal end of one of the first finger portions 122A and the distal end of an adjacent one of the second comb fingers 222 along the horizontal direction (X) is defined as (W). Preferably, a ratio (L/W) is configured to fall within a range of from 10 to 80. It is noted that such a scaling allows more room for the self-aligned vertical comb drive structure 100 to move, and allows a lower potential difference requirement for proper operation.

While both the first finger portions 122A and the second comb fingers 222 taper in the direction toward the gap (G) in this embodiment, in other embodiments, the etching process may be configured such that only one of the first finger portions 122A or the second comb fingers 222 tapers in the direction toward the gap (G) for achieving effects similar to those described above.

The second preferred embodiment has the same advantages as those of the first preferred embodiment.

In the previous embodiments, the second wafer 2 may be one other than the SOI wafer, and may include only the second device layer 22 and the second mask layer 23. That is, the second base layer 21 may be omitted, and the step of removing the second base layer 21 may be omitted as well.

As shown in FIGS. 16 to 20, the third preferred embodiment of the method for fabricating a self-aligned vertical comb drive structure 100 according to the present invention differs from the first preferred embodiment in terms of the following.

Figure 16:
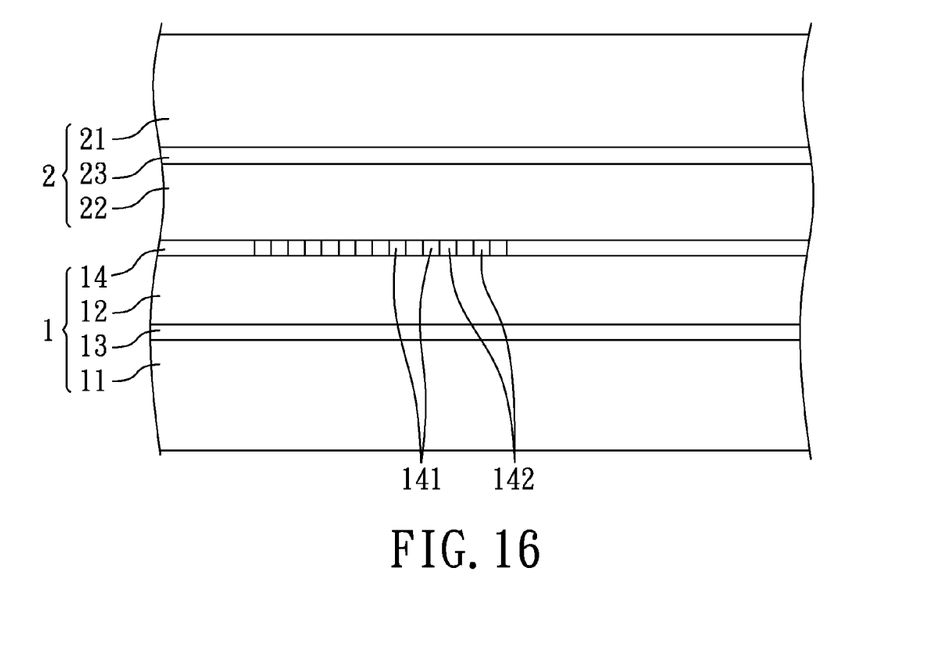
FIGS. 16 to 20 illustrate consecutive steps of a method for fabricating a self-aligned vertical comb drive structure, according to a third preferred embodiment of the invention.
Figure 17:
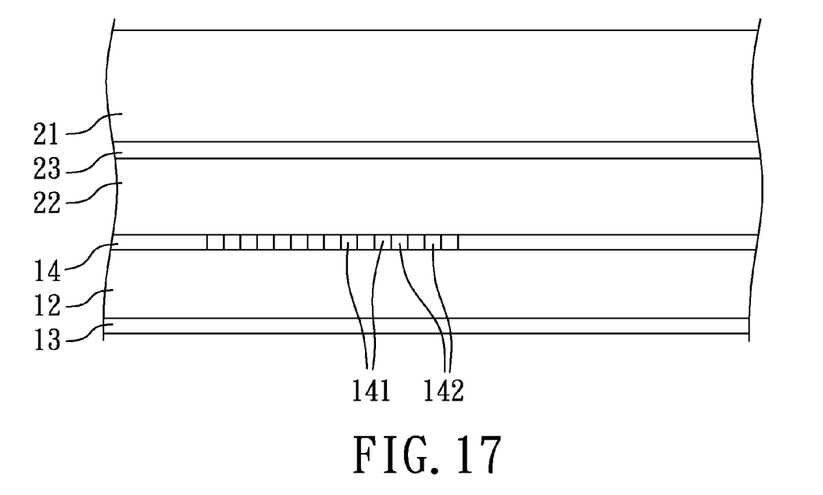

In this embodiment, after the first wafer 1 is provided and the self-aligned pattern is formed on the stop layer 14, the second device layer 22 of the second wafer 2 is immediately bonded to the stop layer 14 (see FIG. 16). Afterwards, as shown in FIG. 17, the first base layer 11 is removed to expose the first mask layer 13.

Figure 18:
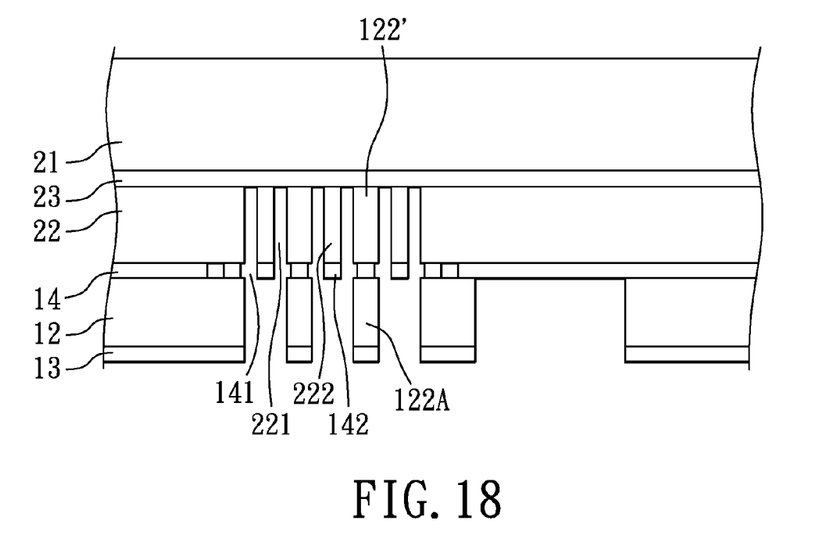

In FIG. 18, a pattern is formed on the first mask layer 13. In this particular step, the pattern on the first mask layer 13 may be less precise, and only covers the first finger portions 122A. Subsequently, the first device layer 12 is etched using the first mask layer 13 as a mask and using the stop layer 14 as an etch stop layer. This process forms a plurality of coarse first finger portions 122A. The second device layer 22 is also etched using the self-aligned pattern on stop layer 14 as a mask and using the second mask layer 23 as an etch stop layer. This process forms the second etched trenches 221, thereby forming the second comb fingers 222 and a plurality of coarse second finger portions 122'.

Figure 19:
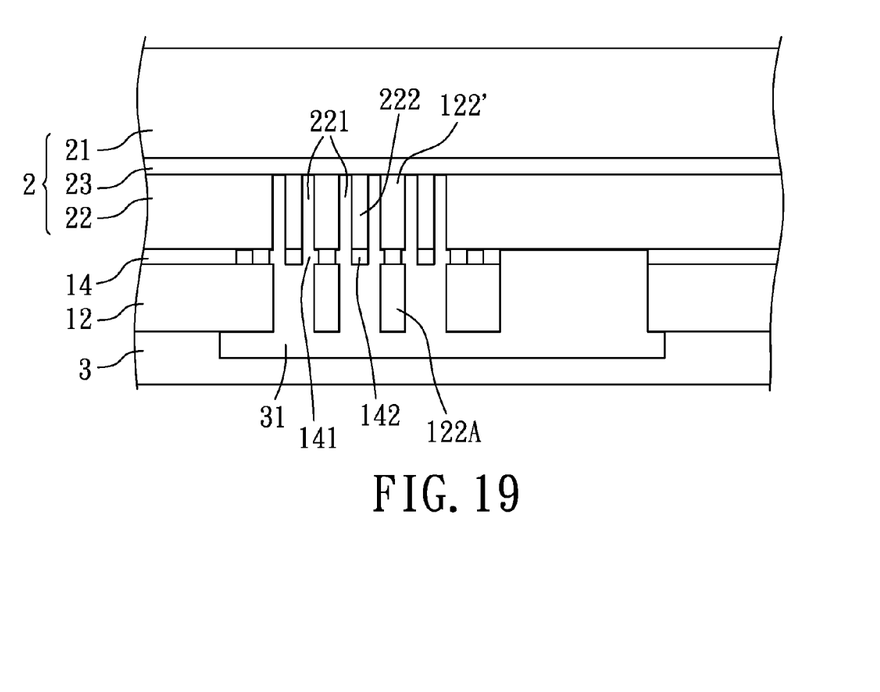

In FIG. 19, the first mask layer 13 and portions of the stop layer 14 are removed before bonding the third wafer 3 to the first device layer 12. Here, portions of the stop layer 14 are removed so as to facilitate formation of devices of the micro scanning mirror 223, which will be formed by subsequent processes, to be movable.

Figure 20:
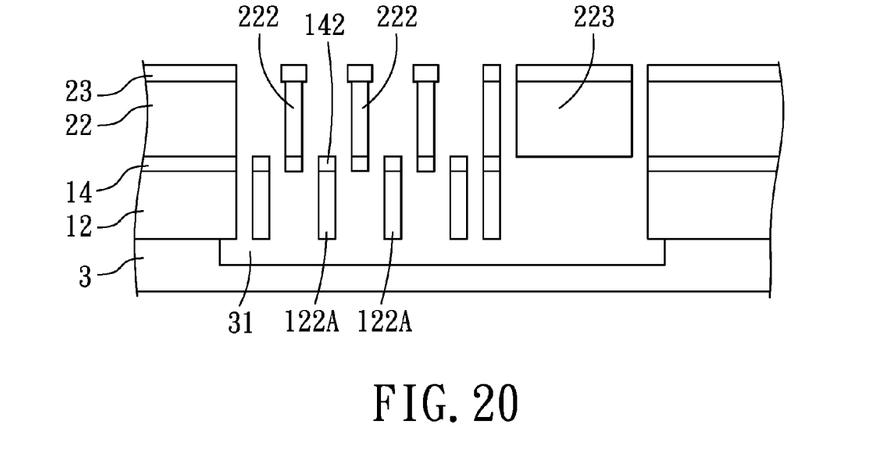

In FIG. 20, the second base layer 21 is removed, and the second mask layer 23 is formed with a pattern thereon. Afterwards, the second device layer 22 is etched using the second mask layer 23 as a mask and using the stop layer 14 as an etch stop layer. This removes the second finger portions 122'. Furthermore, the first device layer 12 is simultaneously etched using the self-aligned pattern on stop layer 14 as a mask. This refines the coarse shapes of the first finger portions 122A and enables formation of the devices of the micro scanning mirror 223. The self-aligning effect is also achieved by using the stop layer 14 to define both the first finger portions 122A and the second comb fingers 222 in a single etching process. The self-aligned pattern in this embodiment may be optionally removed.

In this embodiment, the first wafer 1 and the second wafer 2 may be ones other than the SOI wafer, the first base layer 11 and the second base layer 21 may be omitted, and the steps of removing the first and second base layers 11 and 21 may be omitted as well.

The third preferred embodiment has the same advantages as those of the first preferred embodiment.

In another embodiment, there is provided a self-aligned vertical comb drive structure. The self-aligned vertical comb drive structure may include a first device layer, a second device layer separated from the first device layer by a gap, a first comb structure, and a second comb structure.

The first comb structure includes a plurality of first comb fingers formed solely in the first device layer. The second comb structure includes a plurality of second comb fingers formed solely in the second device layer.

The first comb fingers and the second comb fingers are inter-digitated. Furthermore, the first comb fingers and/or the second comb fingers taper toward the gap.

The self-aligned vertical comb drive structure may be configured such that distances between each of the first comb fingers and adjacent ones of the second comb fingers along a horizontal direction are equal.

The self-aligned vertical comb drive structure may be configured such that the first comb fingers have distal ends distal from the second comb fingers, and the second comb fingers have distal ends distal from the first comb fingers. A distance between the distal ends of the first comb fingers and the distal ends of the second comb fingers along a vertical direction is defined as (L), a minimum distance between the distal end of one of the first comb fingers and the distal end of an adjacent one of the second comb fingers along a horizontal direction is defined as (W), and a ratio (L/W) is configured to fall within a range of from 10 to 80.

To sum up, the method of the present invention allows the first finger portions 122A and the second comb fingers 222 to "self-align" with each other while having the expected shapes. Also, the self-aligned pattern may be removed without affecting the shapes of the first and second comb structures. Furthermore, by dimensioning the first finger portions 122A and the second comb fingers 222 to taper toward the gap (G), the resulting self-aligned vertical comb drive structure 100 may require a lower potential difference to function properly when acting as an actuator. Alternatively, when acting as a sensor, the self-aligned vertical comb drive structure 100 may have increased sensitivity.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A method for fabricating a self-aligned vertical comb drive structure, comprising the following steps of:
   a) forming a multi-layer structure that includes a first mask layer, a first device layer, a stop layer, a second device layer and a second mask layer arranged in the given order in a vertical direction, the stop layer being formed with a self-aligned pattern, the multi-layer structure further including a first comb structure and a second comb structure that are inter-digitated and that are formed via etching using the self-aligned pattern as a first mask, the first comb structure including a plurality of first comb fingers, each having a first finger portion formed in the first device layer and a second finger portion formed in the second device layer and separated from the first finger portion by the self-aligned pattern, the second comb structure including a plurality of second comb fingers and being formed solely in the second device layer; and
   b) removing the second finger portions of the first comb fingers via etching using the second mask layer as a second mask;
   wherein the first device layer is formed from a wafer and wherein the vertical direction is parallel to a thickness direction of the wafer.

2. The method of claim 1, wherein, in step a):
   the stop layer, the first device layer, and the first mask layer are layers of a first wafer;
   the second device layer and the second mask layer are layers of a second wafer; and
   the second device layer is bonded to the stop layer.

3. A method for fabricating a self-aligned vertical comb drive structure, comprising the following steps of:
   a) forming a multi-layer structure that includes a first mask layer, a first device layer, a stop layer, a second device layer and a second mask layer arranged in the given order in a vertical direction, the stop layer being formed with a self-aligned pattern, the multi-layer structure further including a first comb structure and a second comb structure that are inter-digitated and that are formed via etching using the self-aligned pattern as a first mask, the first comb structure including a plurality of first comb fingers, each having a first finger portion formed in the first device layer and a second finger portion formed in the second device layer and separated from the first finger portion by the self-aligned pattern, the second comb structure including a plurality of second comb fingers and being formed solely in the second device layer; and
   b) removing the second finger portions of the first comb fingers via etching using the second mask layer as a second mask;
   wherein step a) includes the following sub-steps of:
   a1) providing a first wafer that includes the first device layer, the first mask layer and the stop layer, wherein the first device layer is disposed between the first mask layer and the stop layer;
   a2) forming the self-aligned pattern on the stop layer;
   a3) forming the first finger portions of the first comb fingers and redundant finger portions that are inter-digitated with the first finger portions of the first comb fingers via etching of the first device layer using the self-aligned pattern of the stop layer as the first mask and using the first mask layer as a first etch stop layer;
   a4) bonding a second wafer, that includes the second device layer and the second mask layer, to the stop layer;
   a5) forming a pattern on the first mask layer;

a6) removing the redundant finger portions via etching of the first device layer using the first mask layer as a third mask and using the stop layer as a second etch stop layer; and a7) forming the second finger portions of the first comb fingers and the second comb fingers via etching of the second device layer using the self-aligned pattern of the stop layer as the first mask and using the second mask layer as a third etch stop layer, thereby resulting in the multi-layer structure having the first and second comb structures.

4. The method of claim 3, wherein, in step a), the first wafer further includes a base layer that covers the first mask layer and that is removed prior to forming the pattern on the first mask layer.

5. The method of claim 3, wherein step b) includes the following sub-steps of:
forming a pattern on the second mask layer to expose the second finger portions of the first comb structure; and
removing the second finger portions of the first comb fingers via etching of the second device layer using the second mask layer as the second mask.

6. The method of claim 5, wherein:
in step a), the second wafer further includes a base layer that covers the second mask layer; and
step b) includes removing the base layer of the second wafer prior to forming the pattern on the second mask layer.

7. The method of claim 3, further comprising, after step (a), the following steps of:
removing the first mask layer to expose the first device layer and the first finger portions of the first comb structure; and
bonding a third wafer to one side of the first device layer opposite to the second device layer.

8. The method of claim 7, wherein the third wafer is formed with a recessed surface that confronts the first comb structure.

9. The method of claim 1, further comprising the step of:
removing the self-aligned pattern so as to define a gap between the first finger portions and the second comb fingers.

10. The method of claim 1, wherein the first finger portions of the first comb fingers and/or the second comb fingers tapers in a direction toward the stop layer.

11. The method of claim 1, wherein step a) includes the following sub-steps of:
a1) providing a first wafer that includes the first device layer, the first mask layer and the stop layer, wherein the first device layer is disposed between the first mask layer and the stop layer;

a2) forming the self-aligned pattern on the stop layer;
a3) bonding a second wafer, that includes the second device layer and the second mask layer, to the stop layer;
a4) forming a pattern on the first mask layer; and
a5) forming the first and second comb structures via etching of the first device layer using the first mask layer as a third mask and using the stop layer as a first etch stop layer and via etching of the second device layer using the self-aligned pattern of the stop layer as the first mask and using the second mask layer as a second etch stop layer.

12. The method of claim 11, wherein, in step b), the shapes of the first finger portions of the first comb fingers are simultaneously refined via etching using the self-aligned pattern of the stop layer as the first mask.

13. A self-aligned vertical comb drive structure, comprising:
a first device layer being formed from a wafer, the wafer having a top surface and a bottom surface opposing the top surface;
a second device layer separated from said first device layer by a gap;
a first comb structure including a plurality of first comb fingers formed solely in said first device layer; and
a second comb structure including a plurality of second comb fingers formed solely in said second device layer;
wherein said first comb fingers and said second comb fingers are inter-digitated; and
wherein said first comb fingers and/or said second comb fingers tapers toward the gap in a direction parallel to a thickness direction of the wafer and perpendicular to the top surface of the wafer.

14. The self-aligned vertical comb drive structure of claim 13, wherein distances between each of said first comb fingers and adjacent ones of said second comb fingers along a horizontal direction are equal.

15. The self-aligned vertical comb drive structure of claim 13, wherein:
said first comb fingers have distal ends distal from said second comb fingers, and said second comb fingers have distal ends distal from said first comb fingers;
a distance between said distal ends of said first comb fingers and said distal ends of said second comb fingers along a vertical direction is defined as (L);
a minimum distance between said distal end of one of said first comb fingers and said distal end of an adjacent one of said second comb fingers along a horizontal direction is defined as (W); and
a ratio (L/W) is configured to fall within a range of from 10 to 80.

* * * * *